(12) United States Patent
Bhowmik et al.

(10) Patent No.: US 7,691,746 B2
(45) Date of Patent: Apr. 6, 2010

(54) FORMATION OF SILICON NITRIDE LAYER ON BACK SIDE OF SUBSTRATE

(75) Inventors: Siddhartha Bhowmik, Salem, OR (US); Steven E. Kelly, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 188 days.

(21) Appl. No.: 11/831,699

(22) Filed: Jul. 31, 2007

(65) Prior Publication Data

US 2009/0032935 A1 Feb. 5, 2009

(51) Int. Cl.
*H01L 21/768* (2006.01)
(52) U.S. Cl. ............... 438/667; 257/E23.174
(58) Field of Classification Search .......... 257/308, 257/414–416, E23.174, 701; 438/667, 637, 438/125, 118, 613
See application file for complete search history.

(56) References Cited

U.S. PATENT DOCUMENTS

| 6,261,923 B1 | 7/2001 | Kuo et al. |
| 6,661,070 B2 * | 12/2003 | Zosel et al. ............. 257/420 |
| 7,011,392 B2 | 3/2006 | Chen et al. |
| 2003/0045051 A1 | 3/2003 | Pohl et al. |
| 2005/0260863 A1 | 11/2005 | Nam et al. |
| 2006/0110910 A1 | 5/2006 | Lee et al. |
| 2006/0160356 A1 | 7/2006 | Hwang |
| 2009/0052008 A1 * | 2/2009 | Mcnie et al. ............. 359/290 |
| 2009/0131858 A1 * | 5/2009 | Fissell et al. ............. 604/57 |

FOREIGN PATENT DOCUMENTS

| JP | 06-252035 | 9/1994 |
| KR | 10-1996-0026557 | 7/1996 |
| KR | 10-2005-0009637 | 1/2005 |

OTHER PUBLICATIONS

International Search Report for Application No. PCT/US2008/071533. Report issued Jan. 30, 2009.

* cited by examiner

*Primary Examiner*—Nathan W Ha

(57) ABSTRACT

A silicon nitride layer is formed on at least a back side of a silicon wafer substrate of a semiconductor device. An oxide layer is formed on at least the silicon nitride layer on the back side of the substrate. The oxide layer protects the silicon nitride layer during processing of the device. The oxide layer is removed prior to packaging the device. After components have been formed on a front side of the substrate opposite the back side, packaging is attached to the silicon nitride layer. The components provide a functionality of the device. The silicon nitride layer completely remains on the back side of the substrate after fabrication of the device has been completed. The silicon nitride layer is adapted to minimize and does minimize bowing of the device.

5 Claims, 3 Drawing Sheets

FIG 1
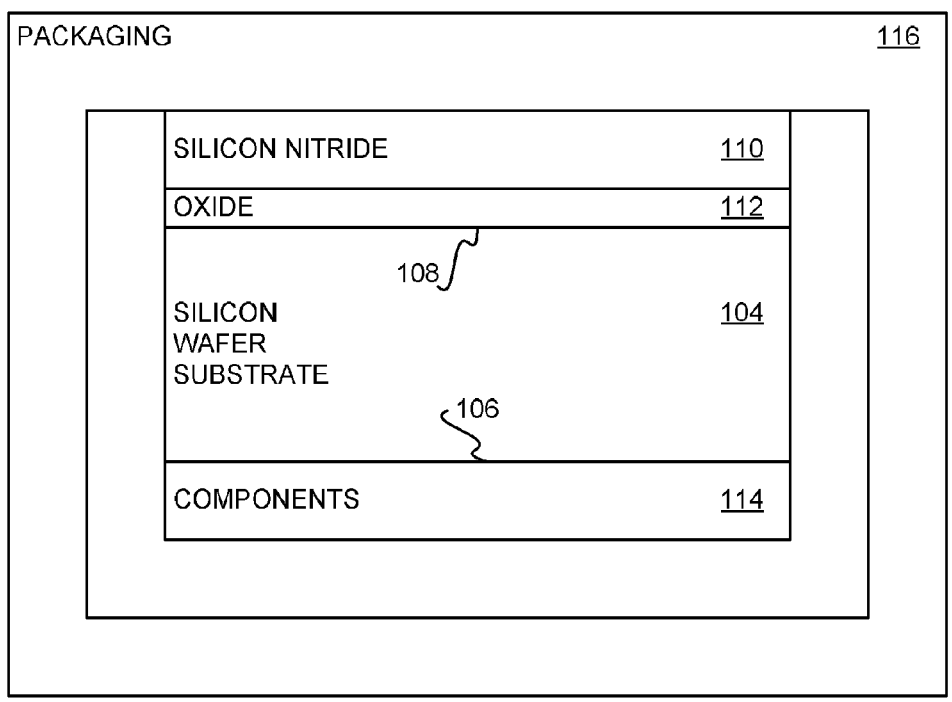
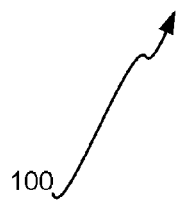

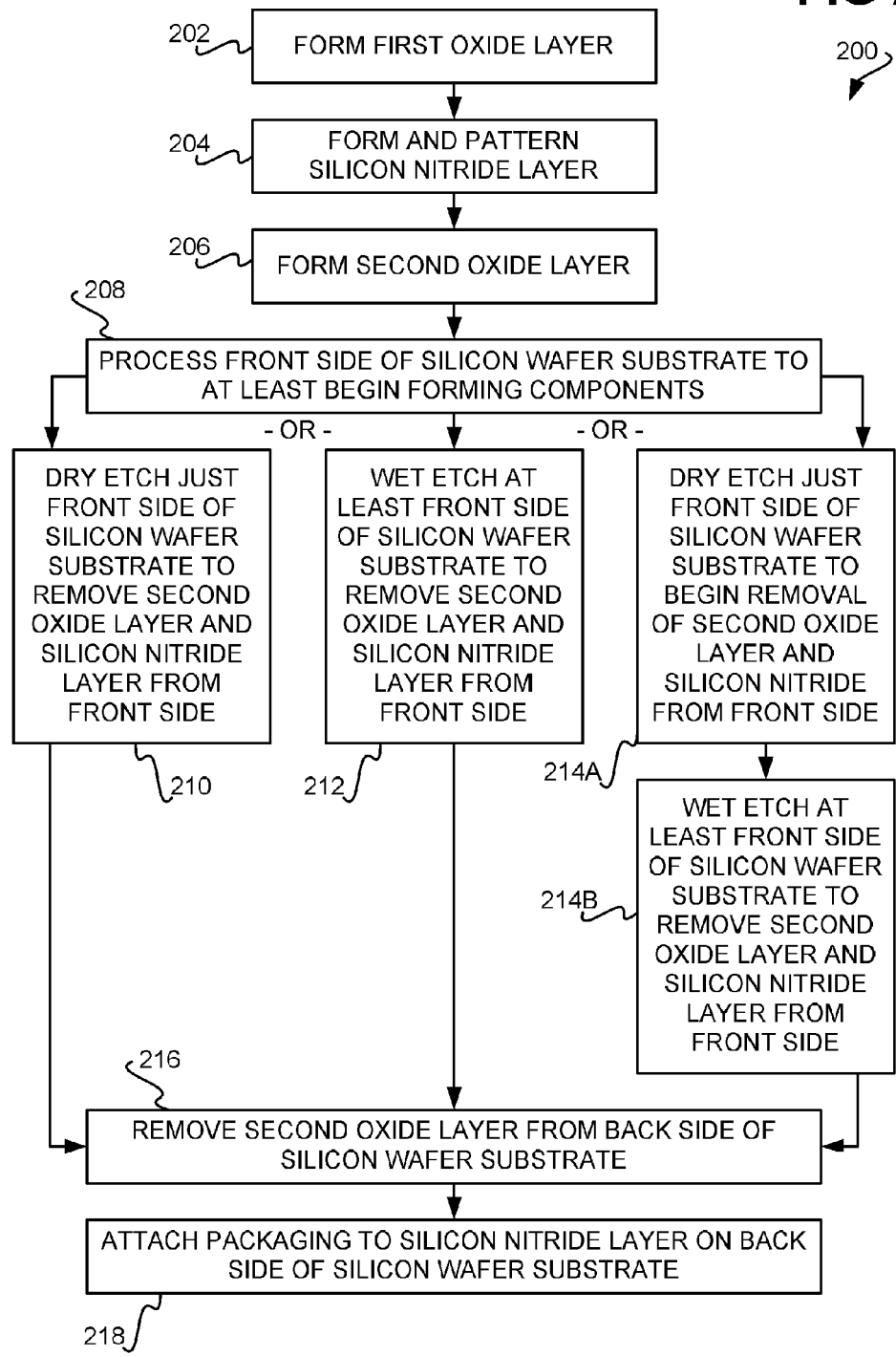

US 7,691,746 B2

FORMATION OF SILICON NITRIDE LAYER ON BACK SIDE OF SUBSTRATE

BACKGROUND

Micro-electromechanical systems (MEMS) devices and inkjet devices may use a combination of etch processes to etch silicon from silicon wafer substrates on which they are fabricated. These etches can be wet or dry etches. To etch silicon selectively, a mask may be employed to prevent or reduce etching from undesired areas. In some types of etching processes, a typical photoresist layer may be insufficient to accommodate the chemistries employed in wet or dry etches.

BRIEF DESCRIPTION OF THE DRAWINGS

FIG. 1 is a diagram of a semiconductor device, according to an embodiment of the present disclosure.

FIG. 2 is a flowchart of a method for at least partially forming a semiconductor device, according to an embodiment of the present disclosure.

DETAILED DESCRIPTION OF THE DRAWINGS

Figure 3A:
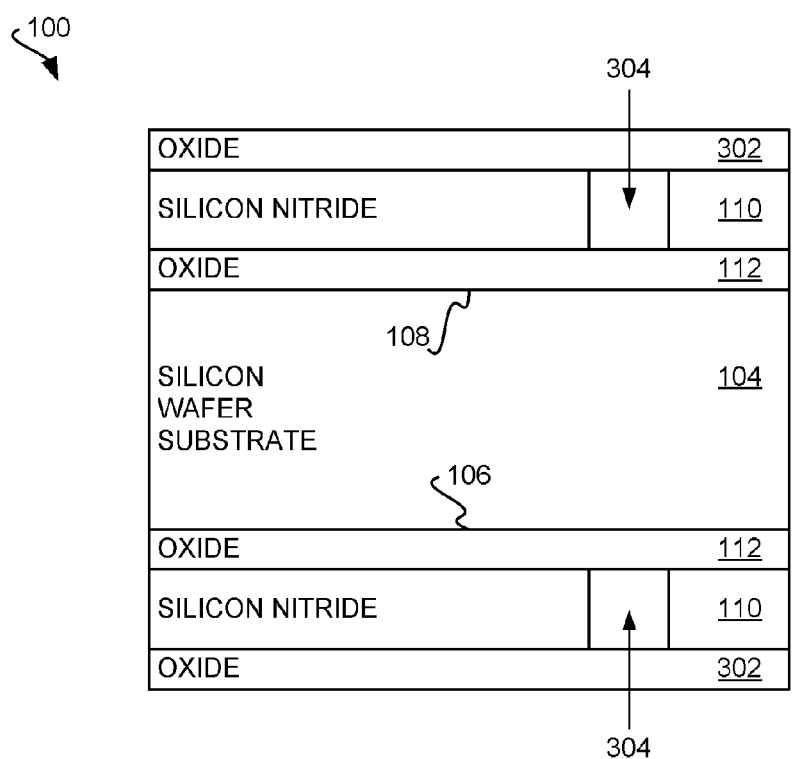
FIGS. 3A and 3B are diagrams illustratively depicting performance of various parts of the method of FIG. 2, according to an embodiment of the present disclosure.

As noted in the background, in some types of etching processes, a typical photoresist layer may be insufficient to accommodate the chemistries employed in wet or dry etches. As such, etching may proceed from the back of the silicon wafer substrate, such that a hard mask material may be included on the back of this substrate, instead of a photoresist layer. An example of such a hard mask material is silicon nitride.

Fabrication of semiconductor devices can thus include forming a silicon nitride layer on a silicon wafer substrate. A thin oxide layer may also be grown under the silicon nitride layer to relieve stress at the interface between the silicon wafer and the silicon nitride layer. The silicon nitride layer functions as a hard mask during fabrication of components of the semiconductor devices, where these components provide the semiconductor devices with their intended functionality. The silicon nitride layer may be patterned prior to growing the thin oxide layer, so that the thicker oxide layer grows selectively in areas where silicon nitride is not present. During subsequent processing, the silicon nitride layers are removed from the silicon wafer substrate. As such, the silicon nitride layers do not remain within the completed semiconductor devices. In contradistinction, in at least some embodiments of the present disclosure, silicon nitride layers remain within the completed semiconductor devices, as is now described in detail.

FIG. 1 shows a finished semiconductor device 100, according to an embodiment of the present disclosure. The semiconductor device 100 may be an electrical device, a mechanical device, an electromechanical device or another type of semiconductor device 100. In one embodiment, the semiconductor device 100 may be a thermal inkjet (TIJ) device or a micro-electromechanical systems (MEMS) device, such as a fluidic MEMS device, where a TIJ device may be considered as one example of such a fluidic MEMS device.

The semiconductor device 100 includes a silicon wafer substrate 104. The silicon wafer substrate 104 starts as a silicon wafer, and may ultimately be divided into individual dies, where each die forms the basis of one semiconductor device, such as the semiconductor device 100. The silicon wafer substrate 104 has a front side 106 and a back side 108. The front side 106 is the side on which semiconductor devices are fabricated, and thus may also be referred to as the device side. The back side 106 is the back of the silicon wafer substrate 104 on which devices are typically not fabricated. The back side 108 is opposite the front side 106. The silicon wafer substrate 104 may be approximately 675 micron in thickness in one embodiment, but can vary significantly from 675 micron in other embodiments. That is, embodiments of the present disclosure do not limit the thickness of the silicon wafer substrate 104.

The semiconductor device 100 includes a silicon nitride layer 110 on the back side 108 of the silicon wafer substrate 104. The silicon nitride layer 110, which is more generally a rigid layer, is present within the finished semiconductor device 100, after packaging. That is, the silicon nitride layer 110 on the back side 108 of the silicon wafer substrate 104 is not completely removed during fabrication of the semiconductor device 100, and remains within the finished device 100 after fabrication has been completed. The silicon nitride layer 110 may be substantially 900 angstroms in thickness in one embodiment. However, in other embodiments, this thickness may vary between a few hundred angstroms to a few thousand angstroms. Those of ordinary skill within the art can appreciate that preservation of the silicon nitride layer 110 is preserved, an underlying oxide layer 112 is also preserved.

The silicon nitride layer 110 may act as a hard mask during fabrication of the semiconductor device 100. Furthermore, the silicon nitride layer 110 reduces bowing of the silicon wafer substrate 104 as compared to where the silicon nitride layer 110 is not present, such as when a material other than silicon nitride is employed as a mask for etching. Reduction of bowing of the silicon wafer substrate 104 is advantageous, because it reduces stresses on the semiconductor device 100, and also can reduce the likelihood or even prevent cracks within the device 100. In addition, in MEMS and TIJ applications, bowing reduction enables subsequent fabrication processes to be performed more easily.

The silicon nitride layer 110 further reduces break-off artifact size, where such break-off artifacts result from wet etching of the silicon wafer substrate 104 causing portions of the layer 110 to overhang the substrate 104. That is, some of the silicon wafer substrate 104, where exposed to the wet etchant, is removed from under the silicon nitride layer 110, resulting in the edge portions of the silicon nitride layer 110 overhanging the substrate 104. These portions of the layer 110 can subsequently break off, becoming the break-off artifacts. Reduction of break-off artifact size is advantageous, because typically these break-off artifacts remain within the semiconductor device 100, such that there is a likelihood that they will affect performance and operation of the device 100. Reducing break-off artifact size can be particularly advantageous when the device 100 being fabricated is a TIJ device.

The silicon nitride layer 100 also promotes adhesion of the silicon wafer substrate 104 to packaging 116, where the semiconductor device 100 can include the packaging 116. The packaging 116 permits the semiconductor device 100 to be employed within another type of device or a system. As depicted in FIG. 1, the packaging 116 completely encompasses the silicon wafer substrate 104 and the other various layers and components attached thereto. However, in another embodiment, the packaging 116 may not completely encompass the silicon wafer substrate 104, as may be the case, for instance, where the semiconductor device 100 is being used in a protected environment. For example, a TIJ printhead is typically used in such a protected environment. It has been found that the silicon nitride layer 110 enables the silicon wafer substrate 104 to better adhere to the packaging 116 than where the silicon nitride layer 110 is not present.

In one embodiment, the semiconductor device 100 may include an oxide layer 112 between the silicon wafer substrate 104 and the silicon nitride layer 110. This oxide layer 112 may be a thermal oxide layer, such as silicon oxide, and may be substantially 200 angstroms in thickness.

Also depicted in FIG. 1 is that the semiconductor device 100 includes one or more components 114 on the front side 106 of the silicon wafer substrate 104. The components 104 impart the semiconductor device 100 with the intended functionality of the device 100, and are not depicted in more detail insofar as the number and types of the components 104 are not limited by embodiments of the present disclosure. Furthermore, there may be other components that contribute to the intended functionality of the semiconductor device 100 on the back side 108 of the silicon wafer substrate 104, which is not depicted in FIG. 1 for illustrative convenience.

FIG. 2 shows a method 200 for at least partially fabricating the semiconductor device 100, according to an embodiment of the present disclosure. It is noted that the method 200 may include other parts, in addition to and/or in lieu of those depicted in FIG. 2. The parts depicted in FIG. 2 are particularly concerned with the formation of the silicon nitride layer 110 on the back side 108 of the silicon wafer substrate 104, where this silicon nitride layer 110 remains on the back side 108 even upon completion of fabrication of the semiconductor device 100.

A first oxide layer 112 may be formed on the back side 108 and/or on the front side 106 of the silicon wafer substrate 104 (202). The first oxide layer 112 may be formed by oxidizing the silicon wafer substrate 104, or by another fabrication process. The first oxide layer 112 may have a thickness of about 200 angstroms on both the back side 108 and the front side 106 of the silicon wafer substrate 104.

A silicon nitride layer 110 is then formed on the back side 108 and/or on the front side 106 of the silicon wafer substrate 104 (204), over the first oxide layer 112 where the first oxide layer 112 has been formed. The silicon nitride layer 110 may be formed by low-pressure chemical vapor deposition (LPCVD), or by another fabrication process. The silicon nitride layer 110 may have a thickness of about 900 angstroms on both the back side 108 and the front side 106 of the silicon wafer substrate 104. The silicon nitride layer 110 may further be etched or otherwise patterned to create a desired pattern within the silicon nitride layer 110, which in FIG. 2 is indicated as part of part 204 for illustrative convenience.

A second oxide layer may then be formed on the back side 108 and/or on the front side 106 of the silicon wafer substrate 104 (206), over the silicon nitride layer 110 that has been formed. The second oxide layer may be formed by thermal oxide growth, or by another fabrication process. The second oxide layer may have a thickness of about 200 angstroms on the silicon nitride layer 110 at the back side 108, as well as on the front side 106 of the silicon wafer substrate 104. The growth of the second oxide layer may be substantially thicker where the silicon nitride 110 has been removed from either or both of the front side 106 and the back side 108 of the silicon wafer substrate 104.

In one embodiment, the first oxide layer 112 is grown on the silicon nitride layer 110 at the same time the second oxide layer is, during a field oxidation process, after the silicon nitride layer 110 has been patterned. That is, in such an embodiment, the silicon nitride layer 110 is initially formed on the back side 108 and/or on the front side 106 of the silicon wafer substrate 104. Where the silicon wafer substrate 104 is exposed through the patterned silicon nitride layer 110, the oxidation process begins. Ultimately, the first oxide layer 112 is formed between the silicon nitride layer 110 and the silicon wafer substrate 104, and the second oxide layer is formed on the silicon nitride layer 110. As can be appreciated by those of ordinary skill within the art, where a furnace oxidation process is employed, the growth of silicon oxide over the silicon nitride of the layer 110 slower than the growth of silicon oxide over the bare silicon of the substrate 104. For instance, where 5000 angstroms of oxide may grow over bare silicon, just 200 angstroms of oxide may grow over silicon nitride.

FIG. 3A shows the resulting semiconductor device 100 after performance of parts 202, 204, and 206 of the method 200, according to such an embodiment of the present disclosure. The silicon nitride layer 110 is initially formed and patterned, such that the silicon wafer substrate 104 is exposed through openings 304 within the silicon nitride layer 110. The silicon wafer substrate 104 is then oxidize to grow field oxide, including the first oxide layer 112 on both the front side 106 and the back side 108 of the silicon wafer substrate 104, and a second oxide layer 302 on both the front side 106 and the back side 108 of the silicon wafer substrate 104. The second oxide layer 302 can be said to include the field oxide that is formed within the opening 304, in one embodiment.

Referring back to FIG. 2, the front side 106 of the silicon wafer substrate 104 may be processed to at least begin forming the components 114 of the semiconductor device 100 that impart the functionality of the device 100 (208). Thereafter, the silicon nitride layer 110 is removed from the front side 106 of the silicon wafer substrate 104, but remains on the back side 108 of the silicon wafer substrate 104. Such removal can be achieved in various embodiments by performing part 210, by performing part 212, or by performing parts 214A and 214B, which are collectively referred to as the parts 214 of the method 200.

In one embodiment, then, just the front side 106 of the silicon wafer substrate 104 is dry etched to remove the second oxide layer 302 and the silicon nitride layer 110 from the front side 106 of the silicon wafer substrate 104 (210). The semiconductor device 100 may be positioned within a plasma etch chamber, for instance, such that just the front side 106, and not the back side 108, of the silicon wafer substrate 104 is subjected to the dry etchant. In this embodiment, the dry etch at least substantially completely removes the second oxide layer 302 and the silicon nitride layer 110 from the front side 106, but not from the back side 108, of the silicon wafer substrate 104, without using any other types of etching processes, such as wet etching.

In another embodiment, at least the front side 106 of the silicon wafer substrate 104 is wet etched to remove the second oxide layer 302 and the silicon nitride layer 110 from the front side 106 of the silicon wafer substrate 104 (212). For example, a spray-type wet etch may be employed, where the wet etchant, which may be hydrofluoric acid in liquid or vapor form, or phosphoric acid, is sprayed onto just the front side 106, and not the back side 108, of the silicon wafer substrate 104. Such spray-type wet etching is a more expensive but a more controlled type of wet etching, allow for just the front side 106, and not the back side 108, of the silicon wafer substrate 104 to come into contact with the wet etchant. In this example, the wet etch at least substantially completely removes the second oxide layer 302 and the silicon nitride layer 110 from the front side 106, but not from the back side 108, of the silicon wafer substrate 104, without using any other types of etching processes, such as dry etching.

As another example, a spray-type wet or vapor hydrofluoric acid etch may be employed to partially remove the second oxide layer 302 from the front side 106 of the silicon wafer substrate 104, or to completely remove the second oxide layer 302 from the front side 106 and partially remove the silicon nitride layer 110 from the front side 106. Thereafter, another type of wet etching may be employed, such as a bath-type wet etch in which the semiconductor device 100 is immersed in the wet etchant, which may also be phosphoric acid. The bath-type wet etch then serves to completely remove the second oxide layer 302 (if any portion is still present) and the silicon nitride layer 110 from the front side 106 of the silicon wafer substrate 104.

However, just a portion of the second oxide layer 302 on the back side 108 of the silicon wafer substrate 104 is removed, since the immersion occurs just long enough to complete removal of the layers 302 and 110 from the front side 106. That is, since the layers 302 and/or 110 have already been at least partially removed due to the spray-type wet etch, the subsequent bath-type wet etch does not last long enough to completely remove the second oxide layer 302 and/or the silicon nitride layer 110 on the back side 108. In this example, the wet etch—which includes both a spray-type wet etch followed by a bath-type wet etch—at least substantially removes the second oxide layer 302 and the silicon nitride layer 110 from front side 106, and may or may not at least partially remove the layer 302 and/or the layer 110 from the back side 108, such that at least a portion of the silicon nitride layer 110 remains on the back side 108.

In another embodiment, just the front side 106 of the silicon wafer substrate 104 is dry etched to begin removal of (i.e., at least partially remove) the second oxide layer 302 and/or the silicon nitride layer 110 from the front side 106 of the silicon wafer substrate 104 (212A). As in part 210, the semiconductor device 100 may be positioned within a plasma etch chamber, for instance, such that just the front side, and not the back side 108, of the silicon wafer substrate 104 is subjected to the dry etchant. In this embodiment, the dry etch just partially removes the second oxide layer 302 and/or the silicon nitride layer 110 from the front side 106, without affecting the layers 110 and 302 on the back side 108, of the silicon wafer substrate 104.

Next, at least the front side 106 of the silicon wafer substrate 104 is wet etched to complete removal of the second oxide layer 302 and the silicon nitride layer 110 from the front side 106 of the silicon wafer substrate 104 (212B). For example, as in part 212, a spray-type wet etch may be employed, where the wet etchant, which may be hydrofluoric acid followed by phosphoric acid, is sprayed onto just the front side 106, and not the back side 108, of the silicon wafer substrate 104. In this example, the wet etch completes removal of the second oxide layer 302 and the silicon nitride layer 110 from the front side 106, without affecting the layers 110 and 302 on the back side 108, of the silicon wafer substrate 104.

As another example, in one embodiment, a bath-type wet etch in which the semiconductor device 100 is immersed in the wet etchant, which may also be phosphoric acid, may be employed. The bath-type wet etch serves to complete removal of the second oxide layer 302 and the silicon nitride layer 110 from the front side 106 of the silicon wafer substrate 104. However, just a portion of the second oxide layer 302 on the back side 108 of the silicon wafer substrate 104 is removed, since the immersion occurs just long enough to complete removal of the layers 302 and 110 from the front side. That is, since the layers 302 and/or 110 have already been at least partially removed due to the dry etch of part 214A, the subsequent bath-type wet etch does not last long enough to completely remove the second oxide layer 302 and/or the silicon nitride layer 110 on the back side 108. In this example, the wet etch completes removal of the second oxide layer 302 and the silicon nitride layer 110 from the front side 106, and just at least partially removes the layers 110 and/or 302 from the back side 108, such that at least a portion of the silicon nitride layer 110 remains on the back side 108.

Therefore, in such an embodiment, the oxide layer 302 on the silicon nitride layer 110 may start off at the same thickness on both the front side 106 and the back side 108 of the silicon wafer substrate 104. Initial processing on the front side 106 may thin the oxide layer 302 so that when the silicon wafer substrate 104 is subsequently etched, the oxide layer 302 is too thin to protect the silicon nitride layer 110 on the front side 106. As a result, such etching of the silicon nitride layer 110 removes the silicon nitride layer 110 from the front side 106, but because the thickness of the oxide layer 302 at the back side 108 remains sufficiently thick, and is not thinned as it is on the front side 106, the silicon nitride layer 110 remains at least substantially intact on the back side 108. In a different embodiment, however, the silicon nitride layer 110 may be grown to a thickness so that it is partially removed from the back side 106, such that enough of the layer 110 remains to promote adhesion, and/or provide other benefits.

Figure 3B:
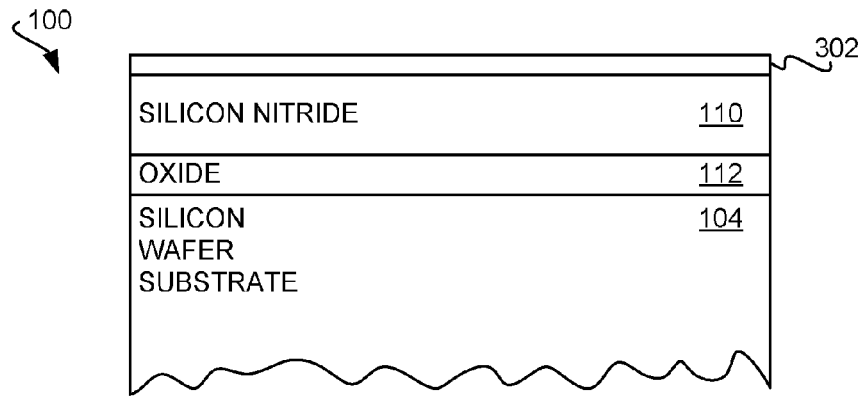

FIG. 3B shows a portion of the resulting semiconductor device 100 after performance of part 210, part 212, or part 214 of the method 200, according to an embodiment of the invention. The front side 106 of the silicon wafer substrate 104 is not depicted in FIG. 3B for illustrative clarity and convenience. Furthermore, the openings 304 depicted in FIG. 3A are not depicted in FIG. 3B for illustrative clarity and convenience. In the example of FIG. 3B, the first oxide layer 112 and the silicon nitride layer 110 remain in their original thicknesses on the back side 108 of the silicon wafer substrate 104, but just a portion of the second oxide layer 302 remains on the back side 108. Thus, a portion of the second oxide layer 302 has been removed from the back side 108, such as resulting from a bath-type wet etch in part 212 or in part 214B. In another example, the entire original thickness of the second oxide layer 302 may remain on the back side 108, resulting from the dry etch in part 210 or from a spray-type wet etch in part 212 or in part 214B, where a bath-type wet etch is not performed.

Referring back to FIG. 2, at some point during fabrication of the semiconductor device 100, such as just prior to packaging of the semiconductor device 100 (after all the components 114 have been formed, the formation of which is not completely depicted in FIG. 2) the second oxide layer 302 is removed from the back side 108 of the silicon wafer substrate 104 (216). For example, chemical-mechanical planarization (CMP) may be employed to prepare the back side 108 for packaging, by removing the second oxide layer 302 therefrom to expose the silicon nitride layer 110. Thus, the packaging is then attached to the silicon nitride layer 110 on the back side 108 of the silicon wafer substrate 104 (218). The semiconductor device 100 may be considered as completely fabricated after packaging, such that it can then be used in another device, in a system, and so on.

We claim:

1. A method comprising:
    forming a silicon nitride layer on at least a back side of a silicon wafer substrate of a semiconductor device;
    forming an oxide layer on at least the silicon nitride layer on the back side of the silicon wafer substrate, the oxide layer protecting the silicon nitride layer during processing of the semiconductor device;
    prior to packaging the semiconductor device, removing the oxide layer; and, after forming one or more components on a front side of the silicon wafer substrate opposite the back side, attaching packaging to the silicon nitride layer, the components providing a functionality of the semiconductor device, wherein the silicon nitride layer completely remains on the back side of the silicon wafer substrate within the semiconductor device after fabrication of the semiconductor device has been completed, the silicon nitride layer adapted to minimize and does minimize bowing of the semiconductor device.

2. The method of claim 1 wherein forming the silicon nitride layer further comprises forming the silicon nitride layer on the front side of the silicon wafer substrate, forming the oxide layer further comprises forming the oxide layer on the silicon nitride layer on the front side of silicon wafer substrate, and the method further comprises:

processing the front side of the silicon wafer substrate to at least begin forming the components on the front side of the silicon wafer substrate; and, dry etching just the front side of the silicon wafer substrate to at least substantially remove the oxide layer and the silicon nitride layer from the front side, wherein the silicon nitride layer remains on the back side of the silicon wafer substrate after dry etching of just the front side of the silicon wafer substrate.

3. The method of claim 1 wherein forming the silicon nitride layer further comprises forming the silicon nitride layer on the front side of the silicon wafer substrate, forming the oxide layer further comprises forming the oxide layer on the silicon nitride layer on the front side of silicon wafer substrate, and the method further comprises:

processing the front side of the silicon wafer substrate to at least begin forming the components on the front side of the silicon wafer substrate; and, wet etching at least the front side of the silicon wafer substrate to at least substantially remove the oxide layer and the silicon nitride layer from the front side, wherein the silicon nitride layer remains on the back side of the silicon wafer substrate after wet etching of at least the front side of the silicon wafer substrate.

4. The method of claim 1 wherein forming the silicon nitride layer further comprises forming the silicon nitride layer on the front side of the silicon wafer substrate, forming the oxide layer further comprises forming the oxide layer on the silicon nitride layer on the front side of silicon wafer substrate, and the method further comprises:

processing the front side of the silicon wafer substrate to at least begin forming the components on the front side of the silicon wafer substrate;

dry etching just the front side of the silicon wafer substrate to at least begin removing the oxide layer and the silicon nitride layer from the front side;

wet etching at least the front side of the silicon wafer substrate to at least substantially complete removal of the oxide layer and the silicon nitride layer from the front side, wherein the silicon nitride layer remains on the back side of the silicon wafer substrate after dry etching and wet etching.

5. The method of claim 1 wherein the method at least partially fabricates a thermal inkjet (TIJ) device as the semiconductor device.

* * * * *

UNITED STATES PATENT AND TRADEMARK OFFICE
CERTIFICATE OF CORRECTION

PATENT NO. : 7,691,746 B2
APPLICATION NO. : 11/831699
DATED : April 6, 2010
INVENTOR(S) : Siddhartha Bhowmik et al.

It is certified that error appears in the above-identified patent and that said Letters Patent is hereby corrected as shown below:

In column 7, line 12, in Claim 2, delete "claim 1" and insert -- claim 1, --, therefor.

In column 7, line 27, in Claim 3, delete "claim 1" and insert -- claim 1, --, therefor.

In column 8, line 10, in Claim 4, delete "claim 1" and insert -- claim 1, --, therefor.

In column 8, line 29, in Claim 5, delete "claim 1" and insert -- claim 1, --, therefor.

Signed and Sealed this

Fifth Day of October, 2010

David J. Kappos
*Director of the United States Patent and Trademark Office*